United States Patent [19]

Teuling

[11] Patent Number: 4,513,228
[45] Date of Patent: Apr. 23, 1985

[54] CIRCUIT FOR GENERATING A SAWTOOTH-SHAPED CURRENT

[75] Inventor: Dirk J. A. Teuling, Eindhoven, Netherlands

[73] Assignee: U.S. Philips Corporation, New York, N.Y.

[21] Appl. No.: 365,715

[22] Filed: Apr. 5, 1982

[30] Foreign Application Priority Data

Apr. 8, 1981 [NL] Netherlands ............. 8101721

[51] Int. Cl.³ .................. H01J 29/70; H01J 29/76
[52] U.S. Cl. ..................................... 315/408
[58] Field of Search ................... 315/408, 399

[56] References Cited

U.S. PATENT DOCUMENTS 4,206,388 6/1980 Ishigaki et al. ............ 315/371
4,361,785 11/1982 Stapleton ..................... 315/389

Primary Examiner—Theodore M. Blum
Attorney, Agent, or Firm—Thomas A. Briody; William J. Streeter; Edward W. Goodman

[57] ABSTRACT

A circuit for generating a sawtooth-shaped current through a coil, a plurality of periodically operated switches being arranged in series, by means of which switches the coil is connected to a trace capacitor during the trace period. During the retrace period, the switches are made non-conductive substantially simultaneously and a supply source produces supply energy for replenishing losses. A retrace capacitor is arranged in parallel with each switch and the supply source is connected in parallel with a number of series-arranged switches which is smaller than the total number of switches. The trace voltage is higher than the voltage of the source.

13 Claims, 7 Drawing Figures

CIRCUIT FOR GENERATING A SAWTOOTH-SHAPED CURRENT

BACKGROUND OF THE INVENTION

The invention relates to a circuit for generating a sawtooth-shaped current having trace and retrace periods through a coil which, during the trace period, is connected to a trace capacitor by means of a plurality of series-arranged controllable, periodically operated switches, which switches are non-conductive substantially simultaneously during the retrace period, in which retrace period the coil, the trace capacitor and a retrace capacitance are part of a resonant network, the elements of which determine the duration of the retrace period and to which supply, energy from a supply source is applied for replenishing energy losses.

Such a circuit is disclosed in U.S. Pat. No. 3,030,444. In this prior art circuit two switches are arranged in series, that terminal of the first switch which is not connected to the second switch being coupled to a first terminal of the supply source and that terminal of the second switch which is not connected to the first switch being coupled to the second terminal of the supply source. This measure has the advantage that the pulse-shaped voltage present across the coil during the retrace period is distributed over two switches. The d.c. component of the voltage on the trace capacitor, the trace voltage, is equal to the supply voltage applied to the circuit. A given value of the trace voltage and consequently of the supply voltage is associated with a given inductance of the coil and a given amplitude of the current therethrough.

SUMMARY OF THE INVENTION

The invention has for its object to provide a circuit of the type referred to in the foregoing, the trace voltage being higher than the voltage from the source so that also in the event of a low supply voltage, for example the voltage obtained from a battery, an adequate sawtooth current can be obtained with simple means. According to the invention, the circuit is characterized in that a retrace capacitor is arranged in parallel with each switch, the supply source being connected in parallel with a number of series-arranged switches which is smaller than the total number of switches in the operating condition, the voltage present across the trace capacitor being higher than that of the supply source.

Preferably, the current is characterized in that the supply source comprises a supply inductance coupled to the junction of two switches and two retrace capacitors.

The circuit may be characterized in that one end of the supply inductance is connected to the junction and the other end to a terminal of a voltage source and that the supply inductance is connected to the other terminal of the voltage source via a transistor. The conduction period of the transistor may be adjustable in dependence on the voltage across the trace capacitor or a voltage derived therefrom.

In one particular embodiment, the circuit is characterized in that means are provided for alternately coupling a second supply source across the total number of switches for generating across the trace capacitor a voltage which is substantially equal to the voltage present across the said capacitor when the first voltage source is coupled to the circuit.

DESCRIPTION OF THE DRAWINGS

The invention will now be further described by way of non-limitative example with reference to the accompanying drawing, wherein.

DESCRIPTION OF THE PREFERRED EMBODIMENTS

Figure 1:
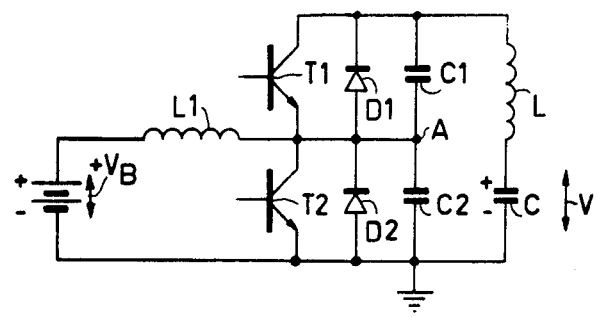
FIG. 1 is a schematic diagram of a first embodiment of the invention.

Referring to FIG. 1, L denotes a coil, for example, the line deflection coil for the electro-magnetic deflection in the horizontal direction of one or more electron beam(s) generated in a picture display tube (not shown). A trace capacitor C is arranged in series therewith. The series arrangements of two npn-switching transistors T1 and T2, of two diodes D1 and D2 and of two retrace capacitors C1 and C2 are arranged in parallel with the network thus formed. The emitter of transistor T1 is connected to the collector of transistor T2 and the anode of diode D1 is connected to the cathode of diode D2. Capacitors C1 and C2 have substantially the same capacitances. The junction thereof is connected to the junction point of transistors T1 and T2 and to the junction point of diodes D1 and D2. One end of an inductance L1, the other end of which is connected to the positive terminal of a supply voltage source $V_B$, is connected to the junction point A thus formed. The negative terminal thereof is connected to ground, as is also the junction point of the emitter of transistor T2, the enode of diode D2, that terminal of capacitor C2 which is not connected to point A and network L, C.

By means of drive means, not shown in FIG. 1 for the sake of simplicity, which are provided in the base lead of transitors T1 and T2 and which are of a prior art construction, said transistors T1 and T2 are supplied with control signals of the line frequency. During a portion of the line period, the trace period, the switches formed by transistor T1 and diode D1, on the one hand, and transistor T2 and diode D2, on the other hand, conduct, either the transistor or the diode being conductive and it being possible to omit the diode if the transistor is capable of reverse conduction. In these circumstances the voltage V of capacitor C is present across coil L during the whole trace period. If, in the first instance, the capacitance of capacitor C is assumed to be infinitely large, then voltage V, the trace voltage, is assumed to be constant. The line deflection current flowing through coil L varies linearly and reverses its direction at the center instant of the trace period. Prior to said instant, this current flows through diodes D1 and D2 and after said instant, it flows through transistors T1 and T2. This holds for a loss-less circuit. The bases of transistors T1 and T2 are supplied with positive drive signals timely before the center instant.

The retrace is initiated at the instant at which transistors T1 and T2 are cut-off substantially simultaneously in response to timely applied negative drive signals. During the retrace period the inductances and the capacitances of the circuit form a resonant network. The variation of the deflection current is now determined by said network and is substantially sinusoidal. At the junction of elements T1, D1, C1 and L the voltage increases to above ground potential in accordance with a substantially cosine function. At the centre instant of the retrace period, the current reverses its direction, while the voltage attains a maximum value. A maximum voltage is present across each switch T1, D1 and T2, D2, respectively, both voltages being substantially equal. The retrace period terminates at the instant at which the two voltages are negative again as a result of which diodes D1 and D2 become conductive.

During the trace period, a current coming from source $V_B$ flows through inductance L1. As the voltage at point A is substantially zero said current does not furnish supply energy, but energy is stored in inductance L1. During the retrace period the voltage is not equal to zero and the energy in inductance L1 produces a current which flows to point A as a result of which the losses are replenished. In a circuit in which current losses occur, the current through inductance L1 has a d.c. component towards point A.

As the capacitances of capacitors C1 and C2 are equal, the retrace pulses thereacross have equal amplitudes. The d.c. component of the voltage across capacitor C2, which is proportional to the amplitude of the retrace pulse thereacross is therefore equal to the d.c. component of the voltage across capacitor C1, which is proportional to the amplitude of the retrace pulse thereacross, the proportionality constants being equal, the reason being that, owing to the fact that switches T1, D1 and T2, D2 are simultaneously in the non-conducting state the two voltages are of the same shape. Since point A is connected to source $V_B$ via an inductance, the first-mentioned d.c. component is equal to the voltage from the source. From this it appears that the d.c. component of the voltage across series network L, C is equal to $2V_B$ and consequently that also voltage V is equal to $2V_B$. If the capacitance of capacitor C is not infinitely large for the sake of the S-correction, so that voltage V during the line period is not constant, then the d.c. component of said voltage is equal to $2V_B$.

From the foregoing it appears that the circuit of FIG. 1 behaves in a similar manner to that of the prior art circuit in which the inductance L1 is not connected to point A but to the junction of elements T1, D1, C1 and L and in which the supply voltage is not $V_B$ but $2V_B$. Consequently the trace voltage is doubled by the circuit shown in FIG. 1. A further difference compared with the above-mentioned prior art circuit is the fact that the d.c. component flowing through the inductance L1 flows only through transistor T2 and not through transistor T1, which does not have any influence on the variation of the deflection current and the retrace pulses.

Except for its voltage supply part, the circuit of FIG. 1 may be of a similar construction as prior art deflection circuits, that is to say it may include a linear correction circuit, a centering circuit, etc. The series network of elements L and C may be replaced by the series arrangement of two series networks each comprising a line deflection coil half and a trace capacitor, the capacitance of which is twice the capacitance of capacitor C, the junction of the two networks being connected to point A. The series arrangement of the primary winding L' of a line transformer and a capacitor C' may be arranged between the junction of elements T1, D1 and C1 and ground (see FIG. 2), the retrace pulses present across one or more secondary windings of the transformer being rectified by means of diodes, for example diode D', to generate direct voltages, for example the high voltage for the final anode of a picture display tube, and wherein deflection coil L may be connected as in FIG. 2 or to a secondary winding. Finally, the east-west modulation of the line deflection current may be applied in known manner, for example by superposing a voltage of the field frequency on voltage $V_B$ or by means of a diode modulator.

In a variant, not shown, of FIG. 1 inductance L1 is connected to the junction of elements T1, D1, C1 and L, while point A is connected to ground. The operation of the circuit thus obtained is the same as that of FIG. 1. Said arrangement has the advantage that the alternating voltages at the ends of coil L have the same absolute values and are of opposite signs so that the center of the coil has ground potential. As a result thereof the capacitive radiation of the coil to other portions of the picture display device of which the described circuits forms part is low.

It is not a requirement that the capacitances of capacitors C1 and C2 are equal. If these capacitances are unequal then the fly-back pulses across them are still of the same shape which results from the fact that switches T1, D1 and T2, D2 are simultaneously conductive and nonconductive, but their amplitudes are unequal. They are inversely proportional to their capacitances. From this it follows that the ratio between trace voltage V and supply voltage $V_B$ is $1 + C2/C1$. Herein C1 and C2, respectively, are the capacitances of the capacitors of the same designation.

Neglecting the east-west modulation, the line deflection current in the circuit of FIG. 1 has a constant amplitude when voltage $V_B$ is constant. If voltage $V_B$ is not constant, for example because this voltage is derived by rectification from the electric line source, then the end of inductance L1, shown on the left in FIG. 1, may be connected to the output terminal of a stabilised supply voltage circuit instead of to the source $V_B$. The end may be connected to, for example, the emitter of a series regulation transistor and to a smoothing capacitor, while the collector of the transistor is connected to source $V_B$. In known manner the base of said transistor is supplied with a voltage which is derived from voltage V, as a result of which the internal resistance of the transistor is controlled in dependence thereon.

Figure 2:
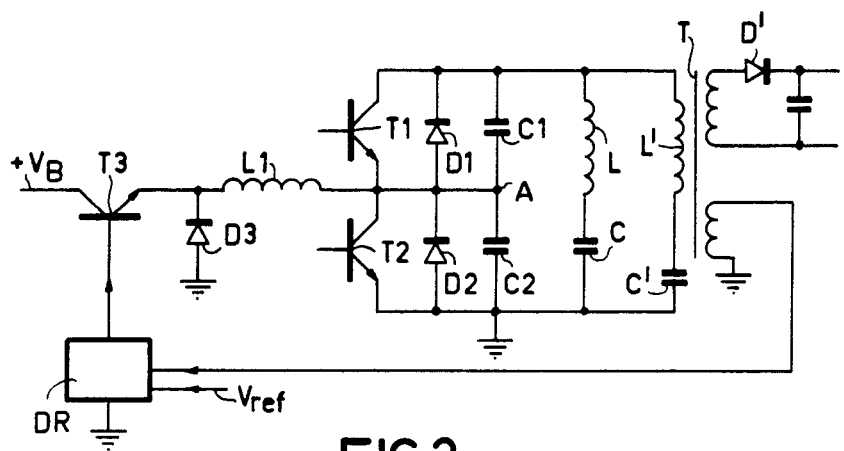
FIG. 2 is a schematic diagram of the circuit of FIG. 1 in combination with a switched-mode supply voltage circuit.

FIG. 2 shows a circuit which is a combination of the circuit shown in FIG. 1 and a switched-mode supply voltage circuit of the series-(forward)-type. The supply transistor T3 is then an npn-switching transistor which is alternately brought into the conductive and the non-conductive state in response to a periodic driving signal of, for example, the line frequency. This signal is applied by means of a driver stage DR. In FIG. 2 the smoothing capacitor mentioned in the foregoing is replaced by a diode D3, the cathode of which is connected to the emitter of transistor T3 and to the left-hand end of inductance L1 while the anode is connected to ground. The current through inductance L1 flows alternately through transistor T3 and diode D3. The conduction period of transistor T3 is controlled in dependence on voltage V or a voltage derived therefrom, for example the voltage at a secondary winding of the line transformer T. For this purpose driver stage DR comprises a comparison stage in which said voltage is compared with a reference voltage $V_{ref}$ for modulating the duration of the drive signal of transistor T3. The east-west correction can be performed because of the fact that the conduction period of transistor T3 is also subjected to a duration modulation at the field frequency. To this end voltage $V_{ref}$ must vary at the field frequency, which variation is generally parabolic.

Figure 3:
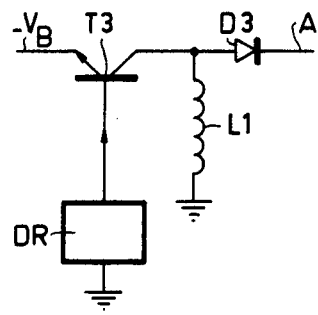
FIG. 3 is a schematic diagram of another type of switched-mode supply voltage circuit.

The switched-mode power supply circuit may be of a different type. FIG. 3 shows such a circuit of the parallel-(flyback-)type. Compared with FIG. 2, inductance L1 and diode D3 have changed place. The cathode of diode D3 is connected to point A and the anode to inductance L1 and to the collector of transistor T3. The emitter of transistor T3 is connected to the negative terminal of voltage source $V_B$ the positive terminal of which is connected to ground. FIG. 3 does not show the deflection section of the circuit, which is identical to the corresponding section in FIG. 2. The same holds for the construction of FIG. 4 in which inductance L1 is the secondary winding of a transformer and is connected to point A via diode D3, while the primary winding of L2 is connected in series with transistor T3 and source $V_B$. The transformer may be used for line isolation. The winding senses of windings L1 and L2 as well as the conduction direction of diode D3 have been chosen so, as is the case in FIG. 3, that diode D3 conducts in the intervals in which transistors T3 is not-conductive and is nonconductive in the intervals in which transistor T3 conducts. The embodiment of FIG. 4 makes an additional parameter available, namely the transformation ratio between transformer windings L1, L2 for the determination of the voltage multiplication introduced by the circuit. Pulse-shaped voltages which may be rectified to generate direct voltages are present across windings L1 and L2, and over any other winding of the transformer. The same holds in the preceding Figures for windings coupled to winding L1.

Figure 4:
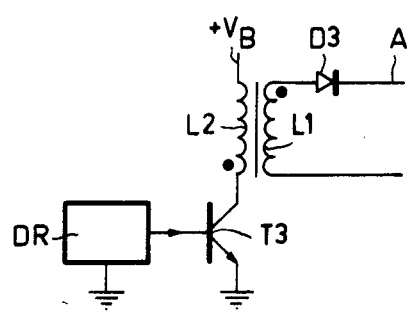
FIG. 4 is a schematic diagram of still another type of switched-mode supply voltage circuit.

In the circuits shown in FIGS. 2, 3 and 4, drive pulses, which are such that the transistors conduct during the second half of the trace period, are applied to transistors T1 and T2, while the conduction time of transistors T3 is adjustable or controllable, respectively. In the embodiment shown in FIG. 5, transistor T3 combines the functions of transistors T2 and T3 of FIG. 4. Herein, winding L2 is connected to the collector of transistor T3, while a diode D4 is included between said collector and point A with the same conduction direction as the collector-emitter path of transistor T1. The cathode of diode D3 is connected to the said point. Transistor T1 is supplied with the same drive signal as transistors T1 and T2 in the preceding Figures. In contrast therewith, the drive signal of transistor T3 has, as is the case in FIGS. 2, 3 and 4 for the transistor having the same designation, a variable or adjustable duration as a result of which the amplitude of the line deflection current is kept constant.

Figure 5:
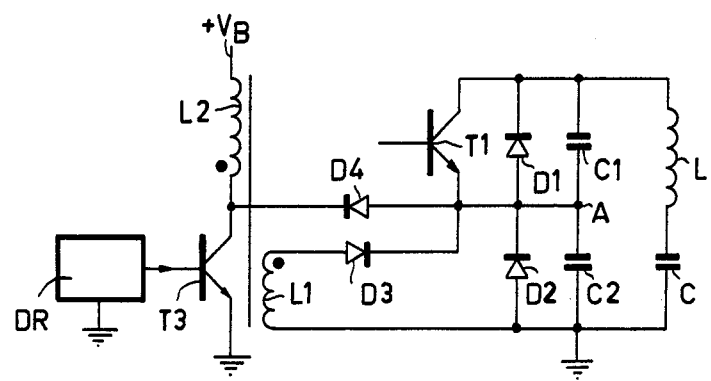
FIG. 5 is a schematic diagram of a second embodiment of the circuit shown in FIG. 2.

The portion of the circuit shown in FIG. 5 comprising elements T3, D2, D3, D4 and C2 is a combined supply voltage and line deflection circuit which is described in the publication "IEEE Transactions on Broadcast and Television Receivers", August 1972, volume BTR-18, no.3, pages 177–182. The addition of the portion comprising elements T1, D1 and C1 does not change the operation of the prior art portion of the circuit, only the trace voltage is increased. It will therefore be sufficient to mention that the deflection current flows through diodes D1 and D2 during the first half of the trace period and through transistors T1 and T3 and through diode D4 during the second half, transistor T3 being made conductive at an instant located in the first half of the period, for storing supply energy in winding L1. The circuit of FIG. 5 can be modified in different ways, which have not been shown. It is, for example, possible to connect the cathode of supply diode D3 to trace capacitor C instead of to retrace capacitor C2. In a further variant the series network of an inductance and a capacitor is in parallel with diode D2 and capacitor C2 or with network L, C and the said cathode is connected to a tap of the inductance. In all variants it may be necessary to provide in known manner, at certain transformation ratios of transformer L1, L2 an isolating diode in series with winding L2, the anode of the diode facing the positive terminal of source $V_B$.

Figure 6:
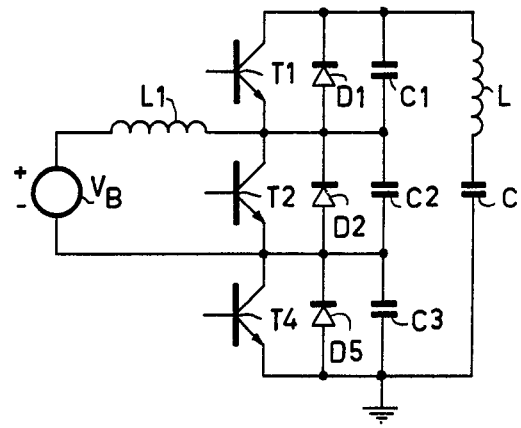
FIG. 6 is a schematic diagram of another embodiment of the circuit shown in FIG. 1.

In the construction shown in FIG. 6 elements T1, D1, C1, T2, D2 and C2 are connected in the same way as shown in FIG. 1. A third npn-switching transistor T4, a third parallel diode D5 and a third retrace capacitor C3 are in parallel with each other and the combination thus formed is arranged in series with the other two similar combinations. Network L, C is included between the collector of transistor T1 and the emitter of transistor T4. One of said combinations, for example T2, D2, C2, is connected to voltage source $V_B$ via an inductance L1, the supply source being the same as in FIG. 1. It will, however, be obvious that alternatively one of the other described variants may be used for this purpose. In a similar manner as for the construction shown in FIG. 1, a voltage multiplication is performed as a function of the ratios C3/C1 and C3/C2. Herein C1, C2 and C3 are the capacitances of the capacitors having the same designation. The supply source may alternatively be connected to two parallel combinations, for example between the collector of transistor T1 and the junction of switches T2, D2 and T4, D5 and retrace capacitors C2 and C3. It will be obvious that the circuit of FIG. 6 may be extended at option with one or more switches with associated retrace capacitors. The circuit then comprises n series-arranged switches, a retrace capacitor being in parallel with each switch and the supply source being coupled to not more than n−1 switches. Herein n is an integer.

In the described circuit, one or more transistors may be replaced by transistors of the pnp-type. As power transistors usually have a comparatively long turn-off delay time, the transistors which must be switched-off substantially simultaneously may be replaced by gate turn-off switches for which the said turn-off delay is much shorter. It may be noted that one or more parallel diodes may be omitted if one diode is in parallel with network L, C, as said diode provides a path for the deflection current during the first half of the trace period.

Figure 7:
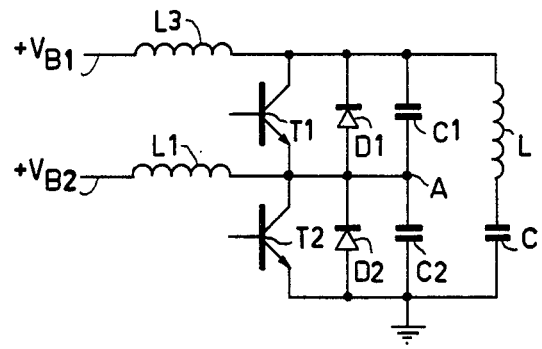
FIG. 7 is a schematic diagram of a further embodiment of the circuit of FIG. 1 suitable for two supply sources.

The described embodiments of the circuit in accordance with the invention relate to a line deflection circuit for generating the deflection current through line deflection coil L, voltage multiplication being performed. FIG. 7 shows an embodiment in which inductance L1 may be connected to a source $V_{B2}$ of 12 V, for example a battery, while an inductance L3 which is connected to the collector may be connected to an, optionally stabilised, source $V_{B1}$ of 150 V. In the first case such a voltage multiplication is performed that the trace voltage across capacitor C is approximately 150 V. In the second case no voltage multiplication is performed and the trace voltage is also equal to 150 V. Consequently, the circuit is suitable for two supply sources.

As direct voltages, namely voltage V at a large capacitance of capacitor C and direct voltages which are derived from transformer T or inductance L1, are generated by the circuit in accordance with the invention, the circuit may also be used for this purpose alone. It will be obvious that the supply voltage circuit obtained may also be used for devices other than picture display devices.

What is claimed is:

1. A circuit for generating a sawtooth-shaped current, having trace and retrace periods, through a coil which, during the trace period, is connected to a trace capacitor by means of a plurality of series-arranged controllable, periodically operated switches, which switches are nonconductive substantially simultaneously during the retrace period, in which retrace period the coil, the trace capacitor and a retrace capacitance are part of a resonant network the elements of which determine the duration of the retrace period and to which circuit, energy from a supply source is applied for replenishing energy losses, characterized in that a retrace capacitor is arranged in parallel with each switch, the supply source being d.c. connected in parallel with a number of series-arranged switches which is smaller than the total number of switches whereby, the voltage in operation across the trace capacitor is higher than that of the supply source.

2. A circuit as claimed in claim 1, characterized in that the supply source comprises a supply inductance coupled to the junction of two switches and two retrace capacitors.

3. A circuit as claimed in claim 2, characterized in that one end of the supply inductance is connected to said junction and the other end to a terminal of a voltage source.

4. A circuit as claimed in claim 3, characterized in that the supply inductance is connected to said junction via a diode.

5. A circuit as claimed in claim 3, characterized in that the supply inductance is connected to the terminal of the voltage source via a transistor.

6. A circuit as claimed in claim 2, characterized in that the supply inductance is coupled to a winding which is connected to a terminal of a voltage source via a transistor.

7. A circuit as claimed in claim 5 or 6, characterized in that the conduction period of the transistor is adjustable in dependence of the voltage across the trace capacitor or a voltage derived therefrom.

8. A circuit as claimed in claim 1, characterized in that the retrace capacitors have equal capacitances.

9. A circuit as claimed in claim 1, characterized in that the retrace capacitors have unequal capacitances.

10. A circuit as claimed in claim 1, characterized in that a winding is coupled to the coil, a rectifier being connected to the winding for generating a d.c. voltage.

11. A circuit as claimed in claim 2, characterized in that a winding is coupled to the supply inductance, a rectifier being connected to the winding for generating a d.c. voltage.

12. A circuit as claimed in claim 1, characterized in that means are provided for alternately coupling a second supply source across the total number of switches for generating across the trace capacitor a voltage which is substantially equal to the voltage present across the said capacitor when the first voltage source is coupled to the circuit.

13. A circuit as claimed in claim 1 for use in a picture display device, characterized in that the coil is a line deflection coil and that the switches operate at the line frequency.

* * * * *